(12) United States Patent
Le Guevel et al.

(10) Patent No.: US 11,387,828 B2
(45) Date of Patent: Jul. 12, 2022

(54) SPIN QUBIT QUANTUM DEVICE READ BY IMPEDANCE MEASUREMENT

(71) Applicant: COMMISSARIAT A L'ENERGIE ATOMIQUE ET AUX ENERGIES ALTERNATIVES, Paris (FR)

(72) Inventors: Loïck Le Guevel, Grenoble (FR); Gérard Billiot, Grenoble (FR); Aloysius Jansen, Grenoble (FR); Gaël Pillonnet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 30 days.

(21) Appl. No.: 17/120,682

(22) Filed: Dec. 14, 2020

(65) Prior Publication Data
US 2021/0184673 A1 Jun. 17, 2021

(30) Foreign Application Priority Data
Dec. 17, 2019 (FR) ...................................... 19 14651

(51) Int. Cl.
*H03K 17/92* (2006.01)
*G06N 10/00* (2022.01)
*H01L 29/66* (2006.01)

(52) U.S. Cl.
CPC ............. *H03K 17/92* (2013.01); *G06N 10/00* (2019.01); *H01L 29/66984* (2013.01)

(58) Field of Classification Search
CPC ... H03K 17/92; G06N 10/00; H01L 29/66984

USPC .......................................................... 327/527
See application file for complete search history.

(56) References Cited

U.S. PATENT DOCUMENTS

2021/0036206 A1* 2/2021 Neill ...................... G06N 10/00

OTHER PUBLICATIONS

French Preliminary Search Report dated Aug. 31, 2020 in French Application 19 14651 filed on Dec. 17, 2019 (with English Translation of Categories of Cited Documents), citing documents AS-AV therein, 3 pages.

(Continued)

*Primary Examiner* — Tomi Skibinski
(74) *Attorney, Agent, or Firm* — Oblon, McClelland, Maier & Neustadt, L.L.P.

(57) ABSTRACT

A spin qubit quantum device including:
a data qubit and a measurement qubit made in a semiconducting layer and coupled to each other by a tunnel junction made in the semiconducting layer, each of which comprising a quantum dot and a control gate;
an inductor coupled to the gate of one of the qubits or to another gate capacitively coupled to one of the qubits, the inductor, and a capacitor formed by said gate forming an LC circuit;
a first input terminal coupled to the LC circuit and receiving a periodic control voltage of frequency $f_r$ substantially equal to the resonant frequency of the LC circuit;
a voltage amplifier comprising an input coupled to the gate to which the inductor is coupled;
an output terminal coupled to an output of the amplifier.

17 Claims, 3 Drawing Sheets

(56) References Cited

OTHER PUBLICATIONS

Bardin et al., "Design and Characterization of a 28-nm Bulk-CMOS Cryogenic Quantum Controller Dissipating Less Than 2 mW at 3K", IEEE Journal of Solid-State Circuits, vol. 54, No. 11, Nov. 1, 2019, pp. 3043-3060 (D1).
De Franceschi et al., "SOI technology for quantum information processing" 2016 IEEE International Electron Devices Meeting (IEDM), Dec. 3, 2016, 4 pages.
Barthelemy et al., "NMOS transistors based Karsilayan & Schaumann gyrator: 'lowpass and bandpass filter applications'", Midwest Symposium on Circuits and Systems, Dec. 27-30, 2003, vol. 1, pp. 97-100.
Bohuslavskyi, "Cryogenic electronics and quantum dots on silicon-on-insulator for quantum computing", Dec. 14, 2018, 188 pages.
Crippa et al., "Gate-reflectometry dispersive readout and coherent control of a spin qubit in silicon", Nature Communications, vol. 10, Article No. 2776, 2019, 6 pages.
Xiao et al., "A 5.4-GHz high-Q tunable active-inductor bandpass filter in standard digital CMOS technology", Analog Integrated Circuitsand Signal Processing, vol. 51, Issue 1, Apr. 2007, pp. 1-9.
Belmas et al., "A New Method for Performance Control of a Differential Active Inductor for Low Power 2.4GHz applications", 2010 IEEE International Conference on Integrated Circuit Design and Technology, Jun. 2-4, 2010, 4 pages.
Hammadi et al., "Design of Wide-tuning High-Q Differential Active Inductor for Multistandard Applications", 2015 IEEE $12^{th}$ International Multi-Conference on Systems, Signals & Devices (SSD15), Mar. 16-19, 2015, 6 pages.

* cited by examiner

SPIN QUBIT QUANTUM DEVICE READ BY IMPEDANCE MEASUREMENT

TECHNICAL FIELD

The invention refers to the field of quantum electronics and quantum computing. The invention refers more specifically to a quantum device in which the reading of electron spins or holes in quantum wells based on semiconductor technology (GaAs, Silicon, etc.), or qubit readout, is achieved through impedance measurement.

PRIOR ART

Quantum computing is based on using a quantum state with two measurable levels as the information vector, referred to as a qubit, and on laws of quantum mechanics (superposition, entanglement, measurement) to execute algorithms. These quantum algorithms have the potential to exceed certain classes of conventional algorithms, for example to perform prime number factorization in the field of cryptography or to solve optimization problems. Regardless of the technology used, a quantum computer comprises several thousand qubits on which three types of operations are performed: initialization of the qubits to a known state, manipulation of the qubits, and readout of the qubits. The implementation of such a quantum computer also requires the setup of error correction codes which need fast, massive and repeated manipulations and readouts on all qubits to prevent information loss.

Semiconductor technologies are being studied for the construction of qubits, owing to their great integration potential, comparably to conventional electronics. Electrons or holes are individually confined to quantum wells located in a cryostat at cryogenic temperatures (less than 4 K, or even less than 1 K) made within confinement structures on a nano scale defined electrostatically and, in the case of silicon, having an architecture close to that of MOSFETs. The application of a static magnetic field (for example from 100 mT to 1 T) makes it possible to reveal the spin of quasi-particles, which is a quantum system with two measurable levels called "spin down" and "spin up." Their quantum state is a superposition of these two states represented by the direction of an arrow within a sphere, called a Bloch sphere. The manipulation (rotation) of these spins is done by means of an alternating component of the magnetic field (with a frequency, for example, of between 1 GHz and several tens of GHz) or by means of an alternating electric field at these same frequencies in the case of an adequate spin-orbit interaction (the case of holes in silicon). Reading of the spins (up or down) allows part of the quantum information to be extracted according to its probability of being in each state, determined by the quantum superposition.

The reading of a quantum spin uses a process of converting spin to an electric charge or to a charge movement (capacitance), followed by a detection of the resulting electric charge. There are several conversion techniques, in particular through the spin-dependent tunneling effect (spin-to-charge conversion) in a reservoir, or through a spin-dependent tunneling effect with another well (spin conversion to charge movement, equivalent to the appearance of a variable capacitance depending on the spin state of the qubit). The detection of the resulting charge is done by means of a current-measured "Single-Electron Transistor" (SET) or by reflectometry with the use of an LC resonator. When measuring by reflectometry, a voltage is applied to an LC resonator at its resonant frequency. The wave reflected by the LC resonator is then retrieved and demodulated in order to extract the phase shift between the incident wave and the reflected wave, this phase shift representing the value of the quantum capacitance and therefore the state of the spin read.

Currently, the advanced electronics used for the readout (synchronous detection amplifier, signal generators, etc.) is placed at ambient temperature (about 300 K) and for each qubit requires wires connecting the electronics located outside the cryostat (at ambient temperature) to the qubits located inside the cryostat. The increase in the number of these address lines with the number of qubits leads to conduction losses that limit the minimum temperature of these cryostats. In addition to these components operating at ambient temperature, active components (amplifiers, filters, etc.) and passive components (couplers, inductances, bias tees, etc.) are placed in compartments operating at different temperatures (77 K, 4 K, <1 K), significantly cluttering the space available inside cryostats.

Low-temperature integration of the readout electronics would be beneficial for reducing the number of inputs and outputs in the cryostat and for increasing the achievable bandwidth thanks to the proximity of the readout electronics to the qubits. However, current readout methods such as reflectometry are not suitable for achieving such integration. Indeed, the use of additional devices (SETs or quantum reservoirs) reduces the number of qubits that can be integrated per unit of surface and requires longer-range interactions between closer neighbors. Consequently, the use of additional devices (SETs or quantum reservoirs) is not conceivable because of the longer-range interactions required between closer qubits. Furthermore, reflectometry requires the propagation of electric waves at frequencies of several hundred MHz for holes (and up to several tens of GHz for electrons), which implies the use of macroscopic components such as directional couplers and discrete inductors. Lastly, the use of macroscopic components around the qubit matrix (the maximum dimensions of which are generally 1 mm by 1 mm) generates stray, or parasitic, capacitances that limit the resonant frequency and the sensitivity of the detection achieved.

The document "Gate-reflectometry dispersive readout and coherent control of a spin qubit in silicon," by A. Crippa et al., Nature Communications, vol 10, Article number 2776 (2019), describes a reflectometry measurement of a quantum capacitance associated with the spins of holes in a double-quantum-well structure on silicon CMOS. The DC bias point of the qubit is applied at ambient temperature and is superimposed on an AC voltage through a bias tee running at a temperature of 20 mK. This AC voltage with a frequency of 339 MHz is produced at ambient temperature, goes through a directional coupler also running at 20 mK, and is reflected to an LC resonator comprising an inductor outside the chip containing the qubits and coupled in series to the quantum capacitor dependent upon the spin state. The reflected signal goes back through the directional coupler and is amplified to 4 K, then returns at 300 K, where the signal is demodulated at the incident frequency (339 MHz). The phase of the demodulated signal is extracted in order to obtain the variation in capacitance due to the spins. The sensitivity is 18 mrad/fF. The spin can be detected with a single measurement ("single-shot") with integration times surpassing 100 ms.

Such a qubit readout has the advantages of not making use of an additional device to perform the capacitive detection (the qubit gate serves as detection capacitance) and having an increased capacitive sensitivity thanks to the series LC resonator used. However, it has the drawbacks of making use of large discrete components (coupler, bias tee, CMS or surface-mounted inductor, etc.) and having a capacitive sensitivity limited by the large stray capacitances due to the various connections.

DISCLOSURE OF THE INVENTION

Thus there is a need to propose a quantum device with at least one spin qubit that is free of the drawbacks of reflectometry readout and allows for low-temperature integration (less than 4 K) of the readout electronics.

To that end, this document proposes a spin qubit quantum device including at least:
- a data qubit and a measurement qubit made in a semiconducting layer and coupled to each other by at least one tunnel junction, or tunnel coupling, made in the semiconducting layer, with each data qubit and each measurement qubit comprising at least one quantum dot and at least one electrostatic control grid coupled to the quantum dot;
- an inductor coupled in parallel or series to the gate of the measurement qubit or to the gate of the data qubit or to another gate capacitively coupled to one of the data or measurement qubits such that the inductor and a capacitor formed by the gate to which the inductor is coupled form an LC circuit;
- a first input terminal configured to receive a periodic control voltage with a frequency $f_r$ substantially equal to the resonant frequency of the LC circuit, $f_{LC}$, and which is coupled to the LC circuit;
- a voltage amplifier comprising an input coupled to the gate to which the inductor is coupled;
- an output terminal coupled to an output of the voltage amplifier.

Contrary to a reflectometry measurement in which a voltage wave is sent out and then the voltage wave reflected off the gate of a measurement qubit is measured, this device proposes the use of an LC circuit comprising an inductor and the gate of at least one measurement qubit or the gate of at least one data qubit or at least one other gate capacitively coupled to one or more of the data or measurement qubits, to which is applied an excitation signal at a frequency equal to its resonant frequency $f_{LC}$, and at the output of which a voltage is measured. Such a measurement corresponds to an impedance measurement from which the quantum spin state of the data qubit is read.

This quantum device can be made with discrete components operating at low temperature (equal to or less than 4 K). However, this quantum device can be made advantageously in such a way that the data and measurement qubits, inductor, voltage amplifier, first input terminal, and output terminal are in the form of an integrated circuit capable of operating at a temperature equal to or less than 4 K. In this way, this integrated circuit, which includes measurement qubits and electronics, features a high integration density and can be placed inside a cryostat operating at cryogenic temperatures (<4 K). This is possible owing to the fact that this quantum device does not make use of large discrete components such as des couplers or bias tees. In addition, integration of all of the readout electronics (to which the voltage amplifier belongs) and the qubits on the same integrated circuit makes it possible to limit the interconnection lengths and therefore the stray capacitances between the various parts of the quantum device, particularly those in the readout electronics, which increases the capacitive sensitivity of the device when reading qubits.

Looking at the LC circuit as a quadripole, the reflectometry measurement of the prior art corresponds to a measurement of the S11 parameter, whereas in the quantum device described herein, the parameter being measured is the S12 or Z11 or Z12 or Z22 parameter.

The quantum device can be used with hole and/or electron spins.

The expression "another gate capacitively coupled to one of the data or measurement qubits" may refer, for example, to a gate made next to the gate of one of the data or measurement qubits, and which, by its proximity to said qubit, is coupled thereto.

Frequency $f_r$ corresponds to the operating frequency of the LC circuit. This frequency $f_r$ is "substantially equal" to the resonant frequency of the LC circuit $f_{LC}$, i.e. a value between the value of this resonant frequency$-f_{LC}/2Q$ MHz and the value of this resonant frequency$+f_{LC}/2Q$ MHz. The resonant frequency of the LC circuit $f_{LC}$ is equal to $$\frac{1}{2\pi\sqrt{L.C}}.$$

This possible variation of the operating frequency of the LC circuit compared to the resonant frequency of the circuit is due to the fact that the resonance of the resonator has a typical width equal to $f_{LC}/Q$, with $$Q = \left(\frac{L}{C}\right)^{\frac{1}{2}}/R$$

corresponding to the quality factor of resonator RLC within which the sensitivity remains intact. The term R physically corresponds to the energy losses of the inductor, that is, either losses in the passive inductor (resistance of the material, skin effect, etc.) or losses in the active inductor due to the conductances of the MOSFETs in the active inductor (resistive losses in the transistors). When in operation around the resonant frequency, the two types of inductors (passive and active) can be reduced to an equivalent RLC circuit, with R corresponding to the equivalent series resistance of the inductor.

The gate to which the inductor is coupled may also be coupled to the input of the voltage amplifier by an electrical connection having a total length "l" such that: $l<c/(10.f_r)$. Since the quantum device takes an impedance measurement from which the quantum spin state of the data qubit is read, it is not necessary to have a long connection length between the amplifier and the gate to which the inductor is coupled, because there is no need to make voltage waves, contrary to prior art devices measuring by reflectometry. The link between the gate to which the inductor is coupled and the amplifier input may be seen as an equipotential line.

With such a connection length, the inductor, amplifier, and measurement qubit are very close and no propagating wave is present in the system, in accordance with the quasi-steady-state approximation (QSSA) that applies in this case. It is not possible to define a reflection parameter in the device, since no wave is being propagated in the system.

QSSA, which allows propagation phenomena to be ignored (an approximation to which the quantum device described herein belongs, contrary to devices using reflectometry), is valid when the length of the electrical connection between the gate to which the inductor is coupled and the input of the voltage amplifier is smaller than the wavelength $\lambda = c/f_r$, where c is the speed of light in the medium in question. In order to truly ignore propagation phenomena and accentuate the validity of QSSA, it is generally considered that the wavelength to take into account for the length of the electrical connection is less than $c/(10.f_r)$. This connection length, for example, is equal to about 10 cm or more generally between 3 cm and 30 cm for an $f_r$ between 1 GHz and 100 MHz.

In a quantum device using reflectometry, the size of the system formed by the qubit, the resonant system coupled to the qubit, and the amplifier is much greater than wavelength $\lambda$. In the quantum device described herein, the size of the system is much smaller than wavelength $\lambda$.

Advantageously, the inductor and/or voltage amplifier may be made in the semiconducting layer.

The inductor may be coupled in parallel to the gate of the measurement qubit or to the gate of the data qubit or to said other gate capacitively coupled to one of the data or measurement qubits, between said gate and a reference electric potential, and the quantum device may furthermore include a voltage-controlled current source comprising an input coupled to the first input terminal and an output coupled to the LC circuit. In this case the LC circuit formed by the inductor and the gate of the measurement qubit corresponds to a parallel LC circuit making it possible to filter all stray signals and noise that are far from the resonant frequency of the LC circuit. The phase sensitivity of a parallel LC circuit is equal to $Q/C_p$, in rad/farads, where Q is the quality factor, which is equal to $$\left(\frac{L}{C_p}\right)^{\frac{1}{2}} / R,$$

and $C_p$ is the stray parallel capacitance of the qubit capacitor. Low-temperature integration of the readout electronics makes it possible to achieve better control of the working frequency (controlled $C_p$), better sensitivity thanks to reduced stray capacitances $C_p$.

In addition, the current source in this case makes it possible to convert the control voltage received over the first input terminal into a control current, and to send this control current to the inductor, that is, the input to the LC circuit.

When the data and measurement qubits, inductor, voltage amplifier, first input terminal, and output terminal are made in the form of an integrated circuit capable of operating at a temperature equal to or less than 4 K, the current source may be part of that integrated circuit.

The current source may include electronic components made in the same semiconducting layer as the qubits.

According to an advantageous embodiment, the inductor may be an active inductor, such as a Karsilayan-Schaumann inductor. Such an active inductor, made of CMOS electronic components, has a reduced size compared to a passive inductor with the same impedance value (on the order of 1 nH/25 µm² for an active inductor and of 1 nH/mm² for a passive inductor), which allows for the integration of several inductors on the integrated circuit, for example one per address line so as to take line measurements in parallel when the quantum device includes a qubit matrix. Such an active inductor also has the advantage of being able to be integrated as close as possible to the qubits, thus minimizing access capacitances. This structure also makes possible in situ control over the parameters of the inductor and thereby have a choice between a high quality factor (which leads to a high device sensitivity) and a low quality factor (which translates into a high measurement speed). Another advantage afforded by using one or more Karsilayan-Schaumann active inductors made with NMOS transistors (except for the bias transistors, which may be P-type transistors) in the quantum device is its low electrical power consumption while still being compatible with increased threshold voltages of transistors at low temperatures.

Advantageously, the inductor may include variable capacitors controlling the values of the inductor and the quality factor independently of each other. Such variable capacitors make it possible to control and optimize the sensitivity/noise and sensitivity/readout speed compromises of the quantum device. In addition, being able to adjust the quality factor of the inductor makes it possible to optimize the readout speed/readout accuracy compromise.

The current source may include at least two MOSFET transistors forming a current mirror coupled to at least one RC filter. As a variant, the current source may comprise other items, such as, for example, a voltage-controlled transistor by applying the superimposing of a DC voltage and an AC voltage, or an RC circuit.

As a variant, the inductor may be coupled in series to the gate of the measurement qubit or to the gate of the data qubit or to said other gate capacitively coupled to one of the data or measurement qubits, between said gate and the first input terminal.

The quantum device may furthermore include:
- a first voltage generator with its output coupled to the first input terminal and capable of outputting the periodic control voltage of frequency $f_r$ to its output;
- a first I/Q demodulator of which one input is coupled to the output terminal and which is capable of demodulating the output signal of the voltage amplifier at frequency $f_r$.

According to an advantageous configuration, the quantum device may include a qubit matrix comprising a plurality of data qubits and a plurality of measurement qubits made in the semiconducting layer, with each data qubit being coupled to one of the measurement qubits by at least one tunnel junction made in the semiconducting layer.

In this case, the gates of the data qubits belonging to the same column in the matrix may be coupled electrically to each other, and the gates of the measurement qubits belonging to the same row in the matrix may be coupled electrically to each other.

In the presence of such a qubit matrix, and in the configuration of the paragraph above, the quantum device may furthermore include:
- a second voltage generator including a plurality of outputs, each coupled to the gates of data qubits belonging to the same column in the matrix, and capable of outputting to its outputs periodic voltage signals of frequency $f_{m,i}$ which are different from each other and less than frequency $f_r$;
- a second I/Q demodulator, one input of which is coupled to the output of the first I/Q demodulator and which is capable of demodulating the output signal of the first I/Q demodulator at frequencies $f_{m,i}$.

Such a readout architecture is compatible with frequency multiplexing of qubits, allowing for simultaneous measurement of a matrix of quantum spins.

The device may include a plurality of inductors with each one coupled in parallel or in series to the gates of the measurement qubits belonging to the same row in the matrix, or to other gates capacitively coupled to said measurement qubits such that each inductor and the gates of said measurement qubits or said other gates of the same row in the matrix form an LC circuit.

The quantum device may include the first voltage generator and the first I/Q demodulator, the first voltage generator and the first I/Q demodulator may be part of a first circuit separate from the integrated circuit and in which, when the quantum device includes the second voltage generator and the second I/Q demodulator, the second voltage generator and the second I/Q demodulator may be part of a second circuit separate from the integrated circuit. Consequently, the first and second voltage generators and the first and second I/Q demodulators do not have to be integrated into the circuit including the qubit matrix and the readout electronics, and may operate at a non-cryogenic temperature (greater than 4 K), for example at ambient temperature.

The quantum device may furthermore include, when the data and measurement qubits, the inductor, the voltage amplifier, the first input terminal, and the output terminal are made in the form of an integrated circuit, a cryostat configured to provide a closed space in which the temperature is equal to or less than 4 K, with the integrated circuit being able to be placed in the closed space of the cryostat.

The quantum device may apply to the following fields: quantum computing, quantum engineering, remote capacitance measurement systems (capacitive sensor interfaces).

BRIEF DESCRIPTION OF THE DRAWINGS

The present invention will be more readily understood from a reading of the description of embodiments, given purely as examples and not intended to limit in any way, in reference to the appended drawings, in which.

Identical, similar, or equivalent parts of the various figures described below have the same numerical references so as to facilitate the reading of the various figures.

In an effort to make the figures more legible, the various parts in the figures are not necessarily shown according to a uniform scale.

The various possibilities (variants and embodiments) must be understood as not being exclusive of each other, and may therefore be combined.

DETAILED DESCRIPTION OF PARTICULAR EMBODIMENTS

The operating principle of a quantum device 100 implementing a new method for reading the quantum spin state of a qubit is described below in reference to FIG. 1.

Figure 1:
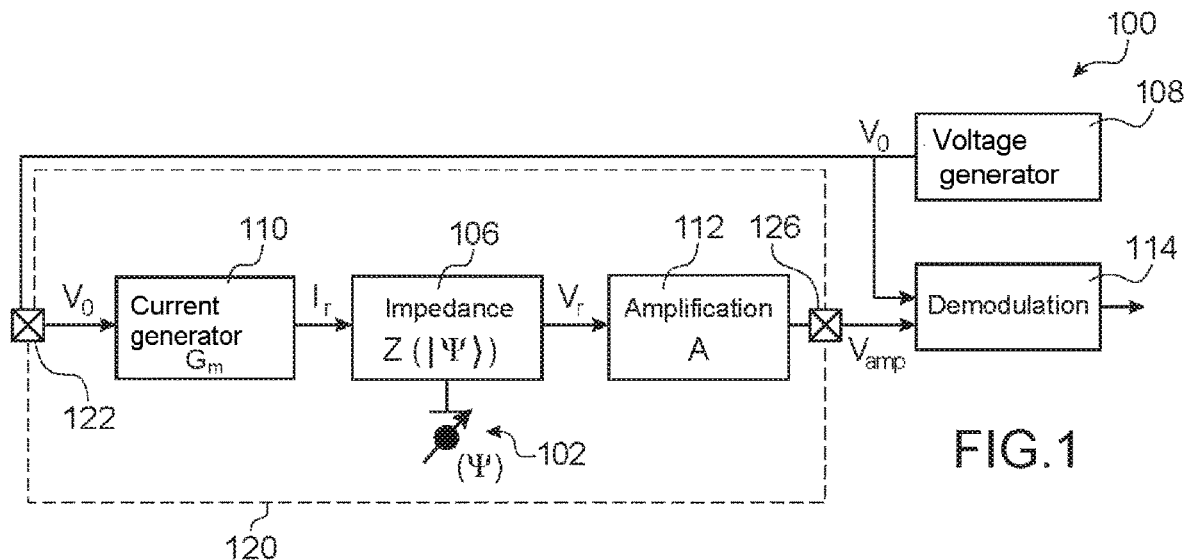
FIG. 1 shows a schematic diagram of the operation of the quantum device.

The quantum device 100 includes at least one data qubit, not shown in FIG. 1, and at least one measurement qubit 102 by which the measurement of the quantum spin state of the data qubit is intended to be performed. The data and measurement qubits are made in a semiconducting layer (not shown in FIG. 1) and are coupled to each other by at least one tunnel junction also made in the semiconducting layer.

Each data and measurement qubit comprises, or is formed by, at least one quantum dot and at least one electrostatic control grid coupled to the quantum dot. The data and measurement qubits correspond to quantum wells intended to operate at a cryogenic temperature, i.e. equal to or less than 4 K. In FIG. 1, the quantum state of the data qubit to be measured is represented by $|\psi\rangle$. The measurement and data qubits are similar, for example, to those described in the document "Gate-reflectometry dispersive readout and coherent control of a spin qubit in silicon" by A. Crippa et al., Nature Communications, vol. 10, Article number 2776 (2019).

The quantum device 100 also includes an inductor 104 (not shown in FIG. 1) coupled in parallel or in series to the gate of one or more measurement qubits 102 such that the inductor 104 and the capacitance formed by the gate or gates of the measurement qubit or qubits 102 form an LC circuit. For example, the inductor 104 may be coupled in parallel to the measurement qubits 102, between the gate or gates of the measurement qubit or qubits 102 and a reference electric potential. The impedance of this LC circuit is symbolized in FIG. 1 and is given the reference number 106. This impedance is represented by $Z(|\psi\rangle)$ because the value thereof is a function of the value of the measured quantum state $|\psi\rangle$ of the data qubit or qubits (the value of the capacitance of the gate of a measurement qubit changes if the two spins of the data and measurement qubits coupled to each other by a tunnel junction are in different states, and does not change if the two spins of the data and measurement qubits are in similar states). Advantageously, the inductor 104 is made in the same semiconducting layer as the data and measurement qubits. In addition, the inductor 104 is advantageously an active Karsilayan-Schaumann inductor and may include variable capacitors controlling the values of the inductor and the quality factor thereof independently of each other.

The quantum device 100 also includes a first voltage generator 108 outputting a periodic control voltage signal of frequency $f_r$ substantially equal to the resonant frequency of the LC circuit formed by the inductor 104 and the capacitance of the grid of the measurement qubit 102. In FIG. 1, the control signal outputted by the first voltage generator 108 is represented by $V_0$. This control voltage $V_0$ is applied to a first input terminal 122 of the device 100.

The value of the resonant frequency of the LC circuit depends, in particular, on the type of charge carriers, the spin of which is used to form the data and measurement qubits. For example, when the data and measurement qubits are based on the quantum spin state of holes, the value of the resonant frequency of the LC circuit may be equal to several hundred MHz, for example between 100 MHz and 1 GHz. When the data and measurement qubits are based on the quantum spin state of electrons, the value of the resonant frequency of the LC circuit may be equal to several tens of GHz, for example between 10 GHz and 100 GHz.

As a variant, the quantum device 100 may to include the first voltage generator 108. In this case, the signal $V_0$ is generated outside the quantum device 100, which then includes an input over which a signal analogous to the signal $V_0$ is applied.

When the inductor 104 is coupled in parallel to the gate of the measurement qubit 102, the quantum device 100 also includes a current source 110 that is voltage-controlled via a control input receiving the signal $V_0$ (via the first input terminal 122). The current source 110 outputs a current $I_r$, which is also periodic, of frequency $f_r$. Advantageously, the current source 110 is made in the same semiconducting layer as the data and measurement qubits. As an example, the current source 110 may include at least two MOSFET transistors forming a current mirror and coupled to at least one RC filter.

The current $I_r$ is applied to the input of the LC circuit so that the LC circuit will oscillate at the resonant frequency thereof.

Contrary to the methods of the prior art, in which the signal reflected by such an LC circuit is measured to determine the quantum state of the data qubit, here one measures a voltage $V_r$ obtained at the output of the LC circuit, which corresponds to an impedance measurement of the LC circuit (bearing in mind the injection of the current $I_r$ performed in the LC circuit) in order to deduce therefrom the change in impedance due to the measured quantum state.

The quantum device 100 further includes a voltage amplifier 112, an input of which is coupled to the gate of the measurement qubit 102, thus amplifying the signal $V_r$. The signal outputted by the voltage amplifier 112 is valled $V_{amp}$ and is outputted to an output terminal 126. Advantageously, the voltage amplifier 112 is made in the same semiconducting layer as the data and measurement qubits.

The data and measurement qubits 102, the inductor 104, the current source 110, the voltage amplifier 112, the first input terminal 122, and the output terminal 126 are made in the form of an integrated circuit 120 operating at a cryogenic temperature, that is, equal to or less than 4 K. In FIG. 1, the integrated circuit 120 is delimited symbolically by a dashed line.

In addition, the gate of the measurement qubit 102 is coupled to the input of the voltage amplifier 112 by an electrical connection having a total length "l" that is less, or even very much less (by a factor of at least 10), than the ratio $c/(10.f_r)$. The making of such an electrical connection is possible thanks to the integration of the voltage amplifier 112 with the data and measurement qubits in the same integrated circuit 120 operating at a cryogenic temperature.

The quantum device 100 further includes a first I/Q demodulator 114 which, contrary to the other elements of the quantum device 100 described earlier, is not part of the integrated circuit 120 operating at a cryogenic temperature but is intended to operate at a temperature greater than 4 K, for example at ambient temperature. The first I/Q demodulator 114 receives the signals $V_0$ and $V_{amp}$ as input and demodulates the signal $V_{amp}$ at the frequency $f_r$ obtained from the signal $V_0$, which makes it possible to determine the phase of the impedance of the LC circuit and to deduce therefrom the value of $|\psi\rangle$.

The device 100 therefore proposes measuring the phase of the impedance of the LC circuit stimulated by means of a periodic current of a frequency substantially equal to the resonant frequency of the LC circuit.

The impedance Z of the LC circuit may be expressed by the following equation:

$$Z = \frac{1}{1 + \frac{jQ\omega}{\omega_0} - \left(\frac{\omega}{\omega_0}\right)^2}$$

Where Q is the quality factor of the LC circuit and $\omega_0$ is the resonant frequency $f_r$ of the LC circuit.

The phase $\phi_{Vr}$ of the voltage $V_r$ obtained at the output of the amplifier 112 is such that:

$$\phi_{Vr} = -\arctan\frac{Q\omega}{\omega_0} * \frac{1}{1 - \left(\frac{\omega}{\omega_0}\right)^2}$$

At the resonant frequency, that is, for $\omega=\omega_0$, and considering by linear approximation that the capacitance C of the gate of the measurement qubit corresponds to the sum of the stray capacitance $C_p$ coupled to the LC circuit and of the variation $\delta C$ due to the quantum spin state of the measurement qubit, then $\omega_0$ becomes $\omega_0+\delta\omega_0$ with $$\delta\omega_0 = -\frac{1}{2}\frac{\omega_0}{C}\delta C.$$

Considering $\delta C \ll C_p$, the variation of phase $\delta\phi_{Vr}$ due to the quantum spin state of the measurement qubit is therefore such that:

$$\delta\phi_{Vr} \simeq -\arctan\frac{2Q}{\omega_0} * \delta\omega_0 \simeq \arctan Q\frac{\delta C}{C_p} \simeq Q\frac{\delta C}{C_p}$$

In the case of a high sensitivity, with $\delta C \gg C_p$, the phase variation is:
if there is no quantum capacitance: $\delta\phi_{Vr}=0$;
if there is a quantum capacitance: $\delta\phi_{Vr}=+90°$ or $-90°$.

In the quantum device 100, the integration of the data and measurement qubits 102, of the inductor 104, of the current source 110, of the voltage amplifier 112, of the first input terminal 122, and of the output terminal 126 in the same integrated circuit 120 may be done monolithically or by making use of one or more interposers or by making a 3D integrated circuit. Such an integration of these components in a single integrated circuit minimizes stray connection capacitances between these components, which, for example, are on the order of a few pF to several tens of fF, and therefore increase the readout sensitivity of the quantum device 100. The qubits of the device 100 are compatibles with CMOS technologies.

According to a variant, the device 100 may be such that the inductor 104 is coupled, either in series or in parallel, to the gate of a data qubit. According to another variant, the inductor 104 may be coupled, either in series or in parallel, to another gate capacitively coupled to one of the data or measurement qubits.

When the inductor 104 is coupled in series to the gate of a measurement qubit 102 or of a data qubit or to another gate capacitively coupled to one of the data or measurement qubits, the device 100 does not include the current source 110, the voltage $V_0$ being applied directly to one of the terminals of the inductor 104 via the first input terminal 122.

The quantum device 100 according to a first embodiment is described below in reference to FIG. 2.

In this first embodiment, the quantum device 100 includes a qubit matrix formed of a plurality of data qubits and a plurality of measurement qubits made in the same semiconducting layer, each data qubit being coupled to one of the measurement qubits by at least one tunnel junction also made in the semiconducting layer. In an advantageous configuration of this matrix, the gates of the data qubits belonging to the same column in the matrix are coupled electrically to each other, and the gates of the measurement qubits belonging to the same row in the matrix are coupled electrically to each other.

Figure 2:
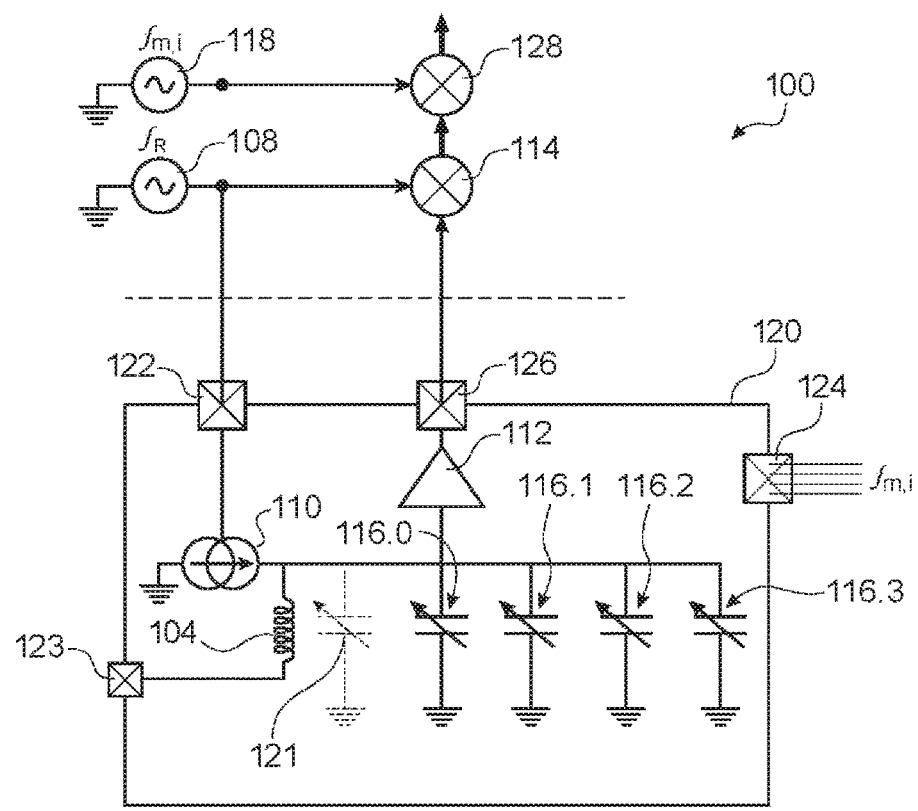
FIG. 2 is a schematic diagram of a quantum device according to a first embodiment.

In FIG. 2, four capacitors with reference numbers 116.0, 116.1, 116.2, and 116.3 represent the capacitors of the grids of four measurement qubits in the same row of the qubit matrix. Since the gates of these four measurement qubits are coupled electrically to each other, the capacitors constituted by these gates are coupled in parallel to each other.

In order to distinguish between the simultaneous measurements taken for the measurement qubits arranged in the same row of the matrix, and therefore the gates of which are coupled electrically to each other, periodic signals of different frequencies are applied to the gates of the data qubits associated with these measurement qubits. To do this, the quantum device 100 includes a second voltage generator 118 including a plurality of outputs, each of which coupled to the gates of data qubits belonging to the same column in the matrix. This second voltage generator 118 is capable of outputting to the outputs thereof periodic voltage signals of frequencies $f_{m,i}$ that are different from each other and less than the frequency $f_r$, where i is equal to the number of measurement qubits in each row of the qubit matrix. In the example shown in FIG. 2, each of the gates of the four data qubits coupled to the four measurement qubits whose capacitors are shown receives a periodic voltage signal of frequency $f_{m,0}$, $f_{m,1}$, $f_{m,2}$ or $f_{m,3}$.

In the example of FIG. 2, the reference number 120 refers to the integrated circuit on which the qubit matrix, the inductor 104, the current source 110, the voltage amplifier 112, the first input terminal 122, and the output terminal 126 are made. The stray connection capacitances between these components of the integrated circuit 120 are symbolized by a capacitor with the reference number 121, shown with a dashed line and coupled in parallel to the capacitors 116.0-116.3. Although a single inductor 104 is shown, the quantum device 100 includes a plurality of inductors 104 such that at least one inductor 104 is associated with each row of qubits.

In this first embodiment, the inductor 104 is a passive inductor. The inductor 104 includes one of the terminals thereof coupled to a second input terminal 123 belonging to the integrated circuit 120 and to which a DC potential is applied. This DC potential, which is applied to the gates of the measurement qubits forming the capacitors 116.0-116.3, traps an electron or a hole in each of the quantum wells of these qubits.

The boundary between the components of the quantum device 100 operating at a cryogenic temperature of less than 4 K, for example less than 1 K, and the components operating at ambient temperature, for example 300 K, is shown symbolically by a dashed line above the integrated circuit 120. The integrated circuit 120 is intended to operate at a cryogenic temperature, whereas the voltage generators 108 and 118 are intended to operate at ambient temperature. The integrated circuit 120 includes the first input terminal 122 to which the periodic signal of frequency $f_r$ is sent from the first voltage generator 108, and a third input terminal 124 to which the periodic signals of frequencies $f_{m,i}$ are sent from the second voltage generator 118.

This quantum device 100 therefore performs a frequency multiplexing of the response signals from the measurement qubits at frequencies $f_m$; generated at ambient temperature.

In this first embodiment, using the equations written earlier, the variation in capacitance δC for each qubit can be expressed by the equation:

$$\delta C = \Sigma_i C_{qu} \cos(f_{m,i} t)$$

Considering $\delta C \ll C_p$, the phase variation $\delta \phi_{V_r}$ of the voltage $V_r$ is:

$$\delta \phi_{V_r} \simeq \sum_i Q \frac{C_{qu}}{C_p} \cos(f_{m,i} t)$$

The signal obtained at the output of the voltage amplifier 112 is outputted to an output 126 of the integrated circuit 120 and is applied to an input of the first I/Q demodulator 114. The phase is extracted by synchronous demodulation at the frequency $f_r$ by the first I/Q demodulator 114. This phase comprises a plurality of signals at the multiplexing frequencies $f_{m,i}$. A second synchronous demodulation at the frequencies $f_{m,i}$ is performed by a second I/Q demodulator 128, which extracts the amplitude of each component of the phase so as to arrive at the individual spin states of the qubits being read.

As a variant of this first embodiment, the device 100 may be such that the inductor 104 is coupled in parallel to a different number of gates of measurement qubits (at least one gate of a measurement qubit). According to another variant, the inductor 104 may be coupled in parallel to the gate of at least one data qubit. According to another variant, the inductor 104 may be coupled in parallel to another gate capacitively coupled to at least one of the data or measurement qubits.

Figure 3:
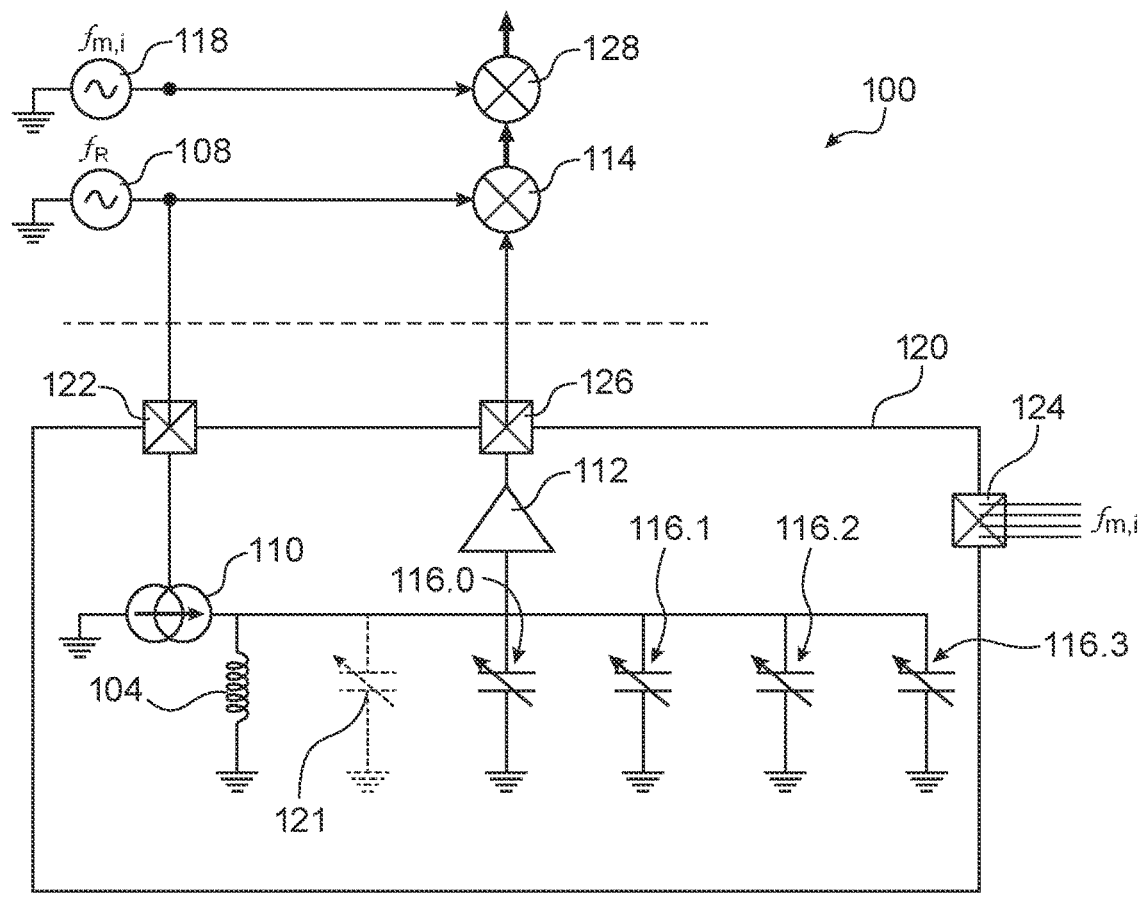
FIG. 3 is a schematic diagram of a quantum device according to a second embodiment.

The quantum device 100 according to a second embodiment is described below in reference to FIG. 3.

Compared to the quantum device 100 according to the first embodiment described above in reference to FIG. 2, and in which the inductor 104 is a passive inductor, the inductor 104 of the quantum device according to the second embodiment is an active inductor. This active inductor is made of MOSFET transistors and capacitors. Advantageously, the inductor 104 is a Karsilayan-Schaumann active inductor. In the example shown in FIG. 3, the inductor 104 includes a first terminal coupled to the gates of the measurement qubits forming the capacitors 116.0-116.3, and a second terminal coupled to ground. The inductor 104 is therefore coupled in parallel to the gates of the measurement qubits which together form a parallel LC circuit.

With such an active inductor, the DC electric potential applied to the gates of the measurement qubits making it possible to trap an electron or a hole in the quantum wells formed by these qubits, is made by means of the common mode $V_{cm}$ of the inductor 104.

Figure 4:
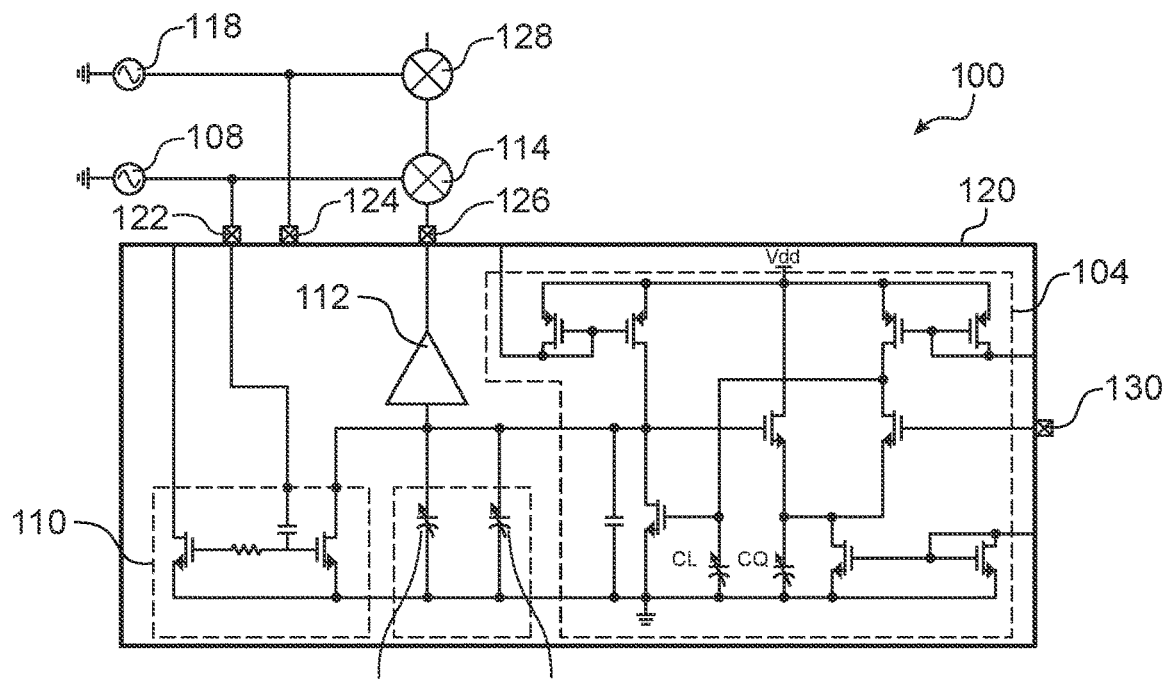
FIG. 4 shows an embodiment example of the quantum device according to the second embodiment.

FIG. 4 shows an embodiment example of the quantum device 100 according to the second embodiment.

In this embodiment example, the active inductor 104 is a Karsilayan-Schaumann active inductor. This active inductor 104 includes a plurality of MOSFET transistors. Apart from those used to form two current mirrors, the other transistors of the active inductor 104 are NMOS inductors to benefit from a greater mobility of the electrons and lower threshold voltages than low-temperature PMOSs. PMOS transistors, however, may be used to reduce the noise generated by these transistors.

The active inductor 104 also includes two variable capacitors called $C_L$ and $C_Q$ in FIG. 4. The value of the inductor 104 is linked to that of the capacitor $C_L$, and the quality factor of the inductor 104 may be adjusted by means of the capacitor $C_Q$. The variable capacitors $C_L$ and $C_Q$ are used to independently control the value of the inductor 104 and the quality factor of the inductor 104. The capacitors $C_L$ and $C_Q$ may be made from banks of capacitors controlled by means of a decoder. The active inductor 104 includes a first input terminal 130 to which a DC electric potential is applied to control the DC bias point of the row of qubits associated with this inductor 104 (only two qubits forming two capacitors 116.0 and 116.1 are shown in FIG. 4).

The active inductor 104 is equivalent to an RLC circuit. The value of the resonant frequency thereof may be modified using $C_L$ by ±10% and the quality factor thereof may be controlled from single digits to hundreds. The equivalent resistance of this RLC circuit may even be made negative to offset any losses when connecting to the row of qubits (access resistance, etc.).

Other construction details of such an active inductor 104 are described in the document by H. Xiao et al., "A 5.4-GHz high-Q tunable active-inductor bandpass filter in standard digital CMOS technology," Analog Integrated Circuits and Signal Processing, April 2007, vol. 51, Issue 1, pp 1-9.

The current source 110 includes a current mirror formed here by two NMOS transistors and coupled to an RC filter setting the DC bias point and the modulation of the current sent to the gates of the measurement qubits. The value of the DC bias voltage is set, for example, in order to sample a current equal to about 1 µA at the input source of the active inductor 104 and to set the value of the transconductance thereof. In this case, the AC voltage of frequency $f_r$ received by the current source 110 is used to generate an AC component of 100 nA, which converts into a voltage amplitude of 100 µV (a value typical of the AC perturbation allowed while keeping the electrons/holes located in the quantum wells of the qubits) on the gates of the qubits ($|Z_{max}|=QL^{1/2}/C^{1/2}$).

The gates of the measurement qubits in the same row are coupled to the input of the active inductor 104. During readout, the phase between the incoming signal of frequency $f_r$ and the outgoing signal is measured by synchronous demodulation, as described earlier.

When the qubits are arranged in a matrix as described earlier, qubit multiplexing is performed. The gates of the measurement qubits in the same row of the matrix are all coupled to the input of the active inductor 104. The DC bias point of the row of qubits is imposed by the DC voltage obtained from the inductor 104. At the time of readout, the qubits are equivalent to capacitors varying with time at multiplexing frequencies $f_{m,i} \ll f_r$ (with $f_{m,i} < 0.1\ f_r$, for example). Since the capacitance formed by the qubits is very small compared to the other capacitances (input capacitance of the inductor 104, connections, etc.), the modulation of quantum capacitance comes down to linearly perturbing the resonant frequency of the inductor 104, causing a linear modulation of the phase of the signal carried at the resonant frequency $f_r$ at these multiplexing frequencies $f_{m,i}$. A demodulation is performed at the resonant frequency $f_r$ to extract the phase varying over time according to the multiplexing frequencies $f_{m,i}$.

Frequency demodulation is thus done to extract the amplitude of the modulation at the frequencies $f_{m,i}$. The quantum state of each qubit is then determined according to the amplitude of the phase modulation at the frequencies $f_{m,i}$.

The various variants described above for the first embodiment may also apply to this second embodiment.

Advantageously, the quantum device 100 in all the embodiments includes a number of inductors 104 equal to the number of rows in the qubit matrix. Each inductor 104 may be integrated at one end of one of the rows of qubits and coupled to the gates of the measurement qubits of that row in the qubit matrix.

In the embodiments and examples described above, the LC circuit of the quantum device 100 is a parallel LC circuit in which the inductor 104 is coupled in parallel to the capacitors formed by the gates of the measurement qubits.

Figure 5:
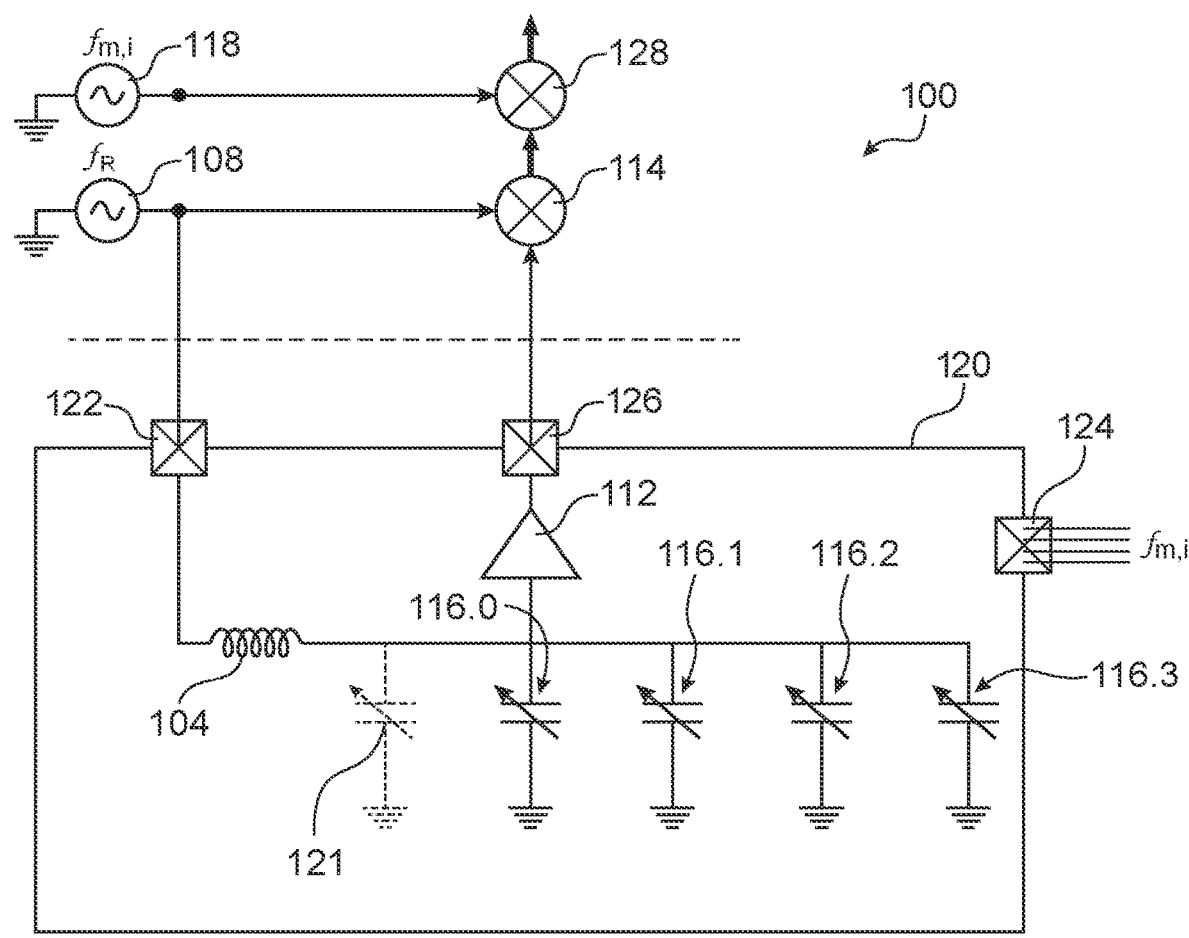
FIG. 5 shows a part of a quantum device according to a third embodiment.

In a third embodiment, it is possible for the LC circuit of the quantum device 100 to be a series LC circuit in which the inductor 104 is coupled in series to the capacitors formed by the gates of the measurement qubits. Such a configuration is shown in FIG. 5, which shows an embodiment example of the device 100 in which the inductor 104 forms, together with the capacitors 116 formed by the gates of a plurality of measurement qubits, a series LC circuit. In this third embodiment, the inductor 104 includes a first of the electrodes thereof coupled to the first input terminal 122 to which the voltage signal of frequency $f_R$ is applied, and a second of the electrodes thereof coupled to the gates of the measurement qubits forming the capacitors 116.

In this third embodiment, the inductor 104 is advantageously made in the form of a differential active inductor, of which an embodiment example is described in the document "A New Method for Performance Control of a Differential Active Inductor for Low Power 2.4 GHz application," by F. Belmas et al., 2010 IEEE International Conference on Integrated Circuit Design and Technology, 2-4 Jun. 2010, and in the document "Design of Wide-tuning High-Q Differential Active Inductor For Multistandard Application," by A. B. Ammadi, 2015 IEEE 12th International Multi-Conference on Systems, Signals & Devices (SSD15), 16-19 Mar. 2015.

The various variants described above for the first and second embodiments may apply to this third embodiment. For example, the inductor 104 may be coupled in series to a different number of gates of measurement qubits (at least one gate of one measurement qubit), or to one or more gates of at least one data qubit or to one or more other gates capacitively coupled to at least one of the data or measurement qubits.

For all the embodiments, variants, and examples described above, although not shown in the various figures, the quantum device 100 may include a cryostat forming a closed space in which the integrated circuit 120 is arranged so as to operate at a temperature equal to or less than about 4 K.

The invention claimed is:
1. A spin qubit quantum device including at least:
a data qubit and a measurement qubit made in a semiconducting layer and coupled to each other by at least one tunnel junction made in the semiconducting layer, each data and measurement qubit comprising at least one quantum dot and at least one electrostatic control gate coupled to the quantum dot;
an inductor coupled in parallel or series to the gate of the measurement qubit or to the gate of the data qubit or to another gate capacitively coupled to one of the data or measurement qubits such that the inductor and a capacitor formed by the gate to which the inductor is coupled form an LC circuit;
a first input terminal configured to receive a periodic control voltage of frequency $f_r$ substantially equal to the resonant frequency of the LC circuit, and which is coupled to the LC circuit;
a voltage amplifier comprising an input coupled to the gate to which the inductor is coupled;
an output terminal coupled to an output of the voltage amplifier.
2. The quantum device according to claim 1, wherein the data and measurement qubits, the inductor, the voltage amplifier, the first input terminal, and the output terminal are made in the form of an integrated circuit capable of operating at a temperature equal to or less than 4 K.

3. The quantum device according to claim 2, further including:
- a first voltage generator of which one output is coupled to the first input terminal and which is capable of outputting the periodic control voltage of frequency $f_r$ to the output thereof;
- a first I/Q demodulator of which one input is coupled to the output terminal and which is capable of demodulating the output signal of the voltage amplifier at the frequency $f_r$, and wherein, when the quantum device includes the first voltage generator and the first I/Q demodulator, the first voltage generator and the first I/Q demodulator are part of a first circuit separate from the integrated circuit, and wherein, when the quantum device includes the second voltage generator and the second I/Q demodulator, the second voltage generator and the second I/Q demodulator are part of a second circuit separate from the integrated circuit.

4. The quantum device according to claim 1, wherein the gate to which the inductor is coupled is also coupled to the input of the voltage amplifier by an electrical connection having a total length "l" such that $l < c/(10 \cdot f_r)$.

5. The quantum device according to claim 1, wherein the inductor and/or the voltage amplifier are made in the semiconducting layer.

6. The quantum device according to claim 1, wherein the inductor is coupled in parallel to the gate of the measurement qubit or to the gate of the data qubit or to said other gate capacitively coupled to one of the data or measurement qubits, between said gate and a reference electric potential, and further including a voltage-controlled current source comprising an input coupled to the first input terminal and an output coupled to the LC circuit.

7. The quantum device according to claim 6, wherein the inductor is a Karsilayan-Schaumann active inductor.

8. The quantum device according to claim 7, wherein the inductor includes variable capacitors controlling the values of the inductor and the quality factor independently of each other.

9. The quantum device according to claim 6, wherein the current source includes at least two MOSFET transistors forming a current mirror and coupled to at least one RC filter.

10. The quantum device according to claim 1, wherein the inductor is coupled in series to the gate of the measurement qubit or to the gate of the data qubit or to said other gate capacitively coupled to one of the data or measurement qubits, between this gate and the first input terminal.

11. The quantum device according to claim 1, further including:
- a first voltage generator of which one output is coupled to the first input terminal and which is capable of outputting the periodic control voltage of frequency $f_r$ to the output thereof;
- a first I/Q demodulator of which one input is coupled to the output terminal and which is capable of demodulating the output signal of the voltage amplifier at the frequency $f_r$.

12. The quantum device according to claim 11, wherein the gates of the data qubits belonging to the same column in the matrix are coupled electrically to each other, and the gates of the measurement qubits belonging to the same row in the matrix are coupled electrically to each other, and further including:
- a second voltage generator including a plurality of outputs, each coupled to the gates of data qubits belonging to the same column in the matrix, and capable of outputting to the outputs thereof periodic voltage signals of frequency $f_{m,i}$ which are different from each other and less than the frequency $f_r$;
- a second I/Q demodulator, one input of which is coupled to the output of the first I/Q demodulator and which is capable of demodulating the output signal of the first I/Q demodulator at the frequencies $f_{m,i}$.

13. The quantum device according to claim 12, including a plurality of inductors, each coupled in parallel or in series to the gates of the measurement qubits belonging to the same row in the matrix or to other gates capacitively coupled to said measurement qubits, such that each inductor and the gates of said measurement qubits or said other gates in the same row of the matrix form an LC circuit.

14. The quantum device according to claim 1, including a qubit matrix comprising a plurality of data qubits and a plurality of measurement qubits made in the semiconducting layer, each data qubit being coupled to one of the measurement qubits by at least one tunnel junction made in the semiconducting layer.

15. The quantum device according to claim 14, wherein the gates of the data qubits belonging to the same column in the matrix are coupled electrically to each other, and the gates of the measurement qubits belonging to the same row in the matrix are coupled electrically to each other.

16. The quantum device according to claim 15, including a plurality of inductors, each coupled in parallel or in series to the gates of the measurement qubits belonging to the same row in the matrix or to other gates capacitively coupled to said measurement qubits, such that each inductor and the gates of said measurement qubits or said other gates in the same row of the matrix form an LC circuit.

17. The quantum device according to claim 1, further including, when the data and measurement qubits, the inductor, the voltage amplifier, the first input terminal, and the output terminal are made in the form of an integrated circuit, a cryostat configured to provide a closed space in which the temperature is equal to or less than 4 K, the integrated circuit being arranged in the closed space of the cryostat.

* * * * *